(12) United States Patent
Ogiso et al.

(10) Patent No.: US 10,916,412 B2
(45) Date of Patent: Feb. 9, 2021

(54) SURFACE MODIFYING DEVICE

(71) Applicant: KASUGA DENKI, INC, Kawasaki (JP)

(72) Inventors: Satoru Ogiso, Kawasaki (JP); Takao Morishita, Kawasaki (JP); Tatsuya Inamura, Kawasaki (JP); Junya Yoshida, Kawasaki (JP); Satoshi Sugimura, Kawasaki (JP)

(73) Assignee: KASUGA DENKI, INC., Kawasaki (JP)

( * ) Notice: Subject to any disclaimer, the term of this patent is extended or adjusted under 35 U.S.C. 154(b) by 301 days.

(21) Appl. No.: 16/305,773

(22) PCT Filed: Apr. 28, 2017

(86) PCT No.: PCT/JP2017/016943
§ 371 (c)(1),
(2) Date: Nov. 29, 2018

(87) PCT Pub. No.: WO2017/208706
PCT Pub. Date: Dec. 7, 2017

(65) Prior Publication Data
US 2020/0328061 A1 Oct. 15, 2020

(30) Foreign Application Priority Data
May 31, 2016 (JP) .................. 2016-109115

(51) Int. Cl.
*H01J 37/32* (2006.01)
*B29C 59/12* (2006.01)
*B29C 71/04* (2006.01)

(52) U.S. Cl.
CPC .......... *H01J 37/3244* (2013.01); *B29C 59/12* (2013.01); *B29C 71/04* (2013.01);
(Continued)

(58) Field of Classification Search
None
See application file for complete search history.

(56) References Cited

U.S. PATENT DOCUMENTS 3,396,308 A * 8/1968 Whitmore ................ H05F 3/04
250/326
4,940,521 A 7/1990 Dinter et al.
(Continued)

FOREIGN PATENT DOCUMENTS

JP 58-225133 12/1983
JP H06-002830 10/1984
(Continued)

OTHER PUBLICATIONS

Tamura, "The Industrial Use Way Example of the Polymeric Surface Property Modification by Atmospheric Pressure Plasma", Oct. 2014, vol. 34, No. 10, pp. 1-19.
(Continued)

*Primary Examiner* — Ashok Patel
(74) *Attorney, Agent, or Firm* — Cozen O'Connor

(57) ABSTRACT

A discharge electrode E in an electrode chamber C is formed of a pair of electrode members 8 and 9 having lengths equal to or greater than a width of a film F. Also, the pair of electrode members 8 and 9 are disposed facing each other so as to sandwich a support member 4 there-between, which has nearly the same length as to electrode members; a gap is formed in a section in which the pair of electrode members 8 and 9 face each other; and this gap is open at a tip of the discharge electrode so as to serve as a gas pathway 15. Meanwhile, in the aforementioned support member 4, a plurality of gas guiding holes 5 are formed in a longitudinal direction thereof, and the gas guiding holes are in communication with a gas supplying system.

11 Claims, 2 Drawing Sheets

(52) U.S. Cl.
CPC .. *H01J 37/32073* (2013.01); *H01J 37/32541* (2013.01); *H01J 37/32568* (2013.01); *H01J 2237/33* (2013.01)

(56) References Cited

U.S. PATENT DOCUMENTS

| | | | |
|---|---|---|---|
| 4,946,568 A | 8/1990 | Kalwar | |
| 2007/0095476 A1* | 5/2007 | Saeki | H05H 1/48 |
| | | | 156/345.43 |

FOREIGN PATENT DOCUMENTS

| | | |
|---|---|---|
| JP | 63-51938 | 3/1988 |
| JP | 2-99163 | 4/1990 |
| JP | 2000-500384 | 1/2000 |
| JP | 2001-131313 | 5/2001 |

OTHER PUBLICATIONS

Sakurai, "Technology for Discharge-Based Modification of Polymer Surface", Seikei-Kakou, Journal of JSSP, Oct. 20, 2000, vol. 12, No. 10, pp. 1-18.

* cited by examiner

SURFACE MODIFYING DEVICE

PRIORITY CLAIM

This is a U.S. national stage of application No. PCT/JP2017/016943, filed on Apr. 28, 2017. Priority is claimed on Japanese Application No. JP2016-109115, filed May 31, 2016, the content of which is incorporated herein by reference.

TECHNICAL FIELD

This invention relates to a surface modifying device that causes discharge energy to act on a surface of a treatment base material, such as e.g., a film or the like, to modify the base material surface.

BACKGROUND ART

A surface modifying device of this type includes a discharge electrode mounted within an electrode chamber and a treatment roller placed facing the discharge electrode. And, the electrode chamber is fed with a replacement gas in accordance with intended surface modification. Then, while the electrode chamber is maintained in an atmosphere of replacement gas, a high-frequency voltage is applied to the discharge electrode to produce a corona discharge between the discharge electrode and the treatment roller.

Discharge energy by the corona discharge as described above is used to modify the surface of a film or the like transferred along the treatment roller.

And, plasma generated during the foregoing corona discharge varies in amount and quality depending on kinds and/or concentrations of the replacement gas in the electrode chamber. If the plasma varies in amount and/or quality, then this has adverse effects on the surface modification of a film or the like.

Therefore, the management of kinds and concentrations of replacement gases is important, but this is insignificant since the kinds of replacement gases are decided in advance, as long as the appropriate selection is ensured.

However, the gas concentration is susceptible to air flowing into the electrode chamber even during the surface modification process, and/or the like. A change in the gas concentration would alter the amount and/or quality of plasma as described above, making it impossible to achieve the intended surface modification.

Further, the electrode chamber must have a size according to the size of the film transferred by the treatment roller. Because, for example, some films have a width reaching 10 meters, the electrode chamber according to the width of this film would be significantly large in volume.

For the purpose of maintaining a constant gas concentration within the electrode chamber of such a large volume, an increase in the amount of replacement gas fed is required. This would lead to a reduction in production efficiency.

To address this, Patent Literatures 1 and 2 disclose a method for feeding the replacement gas directly to a localized area which is a discharge region between the discharge electrode and the treatment roller.

For example, a device disclosed in Patent Literature 1 is configured to feed the replacement gas directly from the discharge electrode. In such a manner, the replacement gas can be fed directly to a localized area which is a discharge region between the discharge electrode and the treatment roller. Because of this, the replacement gas can be easily maintained in a constant concentration at the localized area. Furthermore, since there is no need to fill the entire electrode chamber with the replacement gas, this results in accordingly a reduction in the amount of usage of the replacement gas.

And, a discharge electrode of the device disclosed in Patent Literature 1 is formed of a block having a length roughly corresponding to the film width, and the discharge electrode has a slit formed therein in the length direction of the block, the slit being coupled to a pipe for feeding the replacement gas.

Accordingly, when the replacement gas is fed into the pipe, the gas is fed directly to the discharge region from the slit.

CITATION LIST

Patent Literature

Patent Literature 1: Japanese Examined Patent Application Publication No. Hei06-002830
Patent Literature 2: Japanese Unexamined Patent Application Publication No. 2001-131313

SUMMARY OF INVENTION

Technical Problem

In the surface modifying device disclosed in Patent Literature 1 as described above, if the discharge electrode has a length increased to be adapted to the film width, a slit corresponding to the length is required to be formed.

However, the longer the length of the slit, the more difficult it is to keep the width and the depth constant. If the width and the depth of the slit are not constant, the jet pressure of the replacement gas varies, and in turn the amount and the quality of plasma varies, resulting in a problem arising that stability of the surface modification is impaired.

Further, the need for machining accuracy arises in order to form the slit with an exact width and an exact depth for the purpose of maintaining the stability of the surface modification. Accordingly, the productivity of the discharge electrode formed of a block is decreased.

Further, since the discharge electrode is formed of a block, a corner is created at an end of the block. If there is such a corner, discharges occur intensively on the corner portion. As a result, the corner portion shows a faster deterioration rate than other portions, thus giving rise to a problem of reducing the longevity of the discharge electrode as well as a passage system for feeding gas.

It is an object of the present invention to provide a surface modifying device to achieve greater productivity.

Solution to Problem

In a first aspect of the invention, a discharge electrode placed in an electrode chamber includes a pair of electrode members each of which has a length equal to or longer than a width of a treatment base material such as a film or the like. The pair of electrode members is placed to face each other across a support member that is placed between the electrode members, the support member having a length approximately equal to the length of the electrode members. Also, an interstice is formed in the face-to-face area between the electrode members, and the interstice serves as a gas passage, which opens at a distal end of the discharge electrode.

On the other hand, the support member has a plurality of gas guide holes formed therein in a longitudinal direction of the support member, and the plurality of gas guide holes communicates with a replacement-gas feeding system.

Therefore, a replacement gas introduced from the gas feeding system flows from the gas guide holes of the support member through the gas passage to be emitted from the distal end of the discharge electrode.

Because in this manner the replacement gas is guided from the gas guide holes of the support member into the gas passage, the amount of feeding of the replacement gas depends approximately on the length and the diameter of the gas guide hole.

In a second aspect of the invention, a manifold pipe is placed approximately parallel to the support member and has a plurality of small holes or slits formed therein in a longitudinal direction of the manifold pipe. And the replacement gas introduced into the manifold pipe is guided into the gas guide holes. At this time, the gas guide holes perform the function of adding a throttle resistance to a flow of the replacement gas.

Because, in this manner, the gas guide holes perform the function of adding a throttle resistance to the flow of the replacement gas, the pressure in the manifold pipe is maintained constant, and accordingly the amount of replacement gas emitted from the plurality of gas guide holes can be maintained constant.

In a third aspect of the invention, each of the pair of electrode members has a distal end formed in an arc shape.

Because the distal end of the electrode member is formed in an arc shape to eliminate any corner portion, any discharge does not occur intensively on a portion of the distal end of the discharge electrode.

In a fourth aspect of the invention, the distal end of each of the pair of electrode members has a vortex generation groove formed therein, and the vortex generation groove has a length in a direction approximately perpendicular to a transfer direction of the treatment base material.

If a vortex is generated by the vortex generation groove designed as described above, an entrained flow accompanying the treatment base material such as a film or the like can be blocked from flowing into the discharge area, as well as the replacement gas can be blocked from flowing from the discharge area.

In a fifth aspect of the invention, a controller is provided and controls a rotational speed of the treatment roller and output of a high-voltage power source serving as an energy source for a corona discharge.

Therefore, the transfer speed of the treatment base material and the discharge current can be relatively controlled. In particular, according to the invention, because the replacement gas is fed directly to a localized area which is a discharge area, the amount of replacement gas can be reduced. Achieving effective action of a small amount of replacement gas is dependent on the magnitude of discharge currents and the transfer speed of the treatment base material. The controller is able to perform relative control on the transfer speed of the treatment base material and the discharge current in order to provide stable effects even when using a small amount of replacement gas.

Advantageous Effects of Invention

With the surface modifying device according to the invention, the gas can be guided to the distal end of the discharge electrode in a simple manner that the gas guide holes are formed in the support member. This needs only perforating machining. Accordingly, there is no need to form a slit in a long range as done conventionally.

And, in the perforating machining, holes of a certain size can be formed in a simple manner of selection of a tool. Because of this, there is no variations in hole diameter. No variations in hole diameter ensures the stability of the amount and the force of replacement gas fed from the holes.

As a result, the productivity for discharge electrodes is improved.

Furthermore, even when the discharge electrode deteriorates, only the electrode member is replaced. Because of this, replacing is simple and also the need to replace, e.g., the support member is not eliminated.

DESCRIPTION OF EMBODIMENTS

Figure 1:
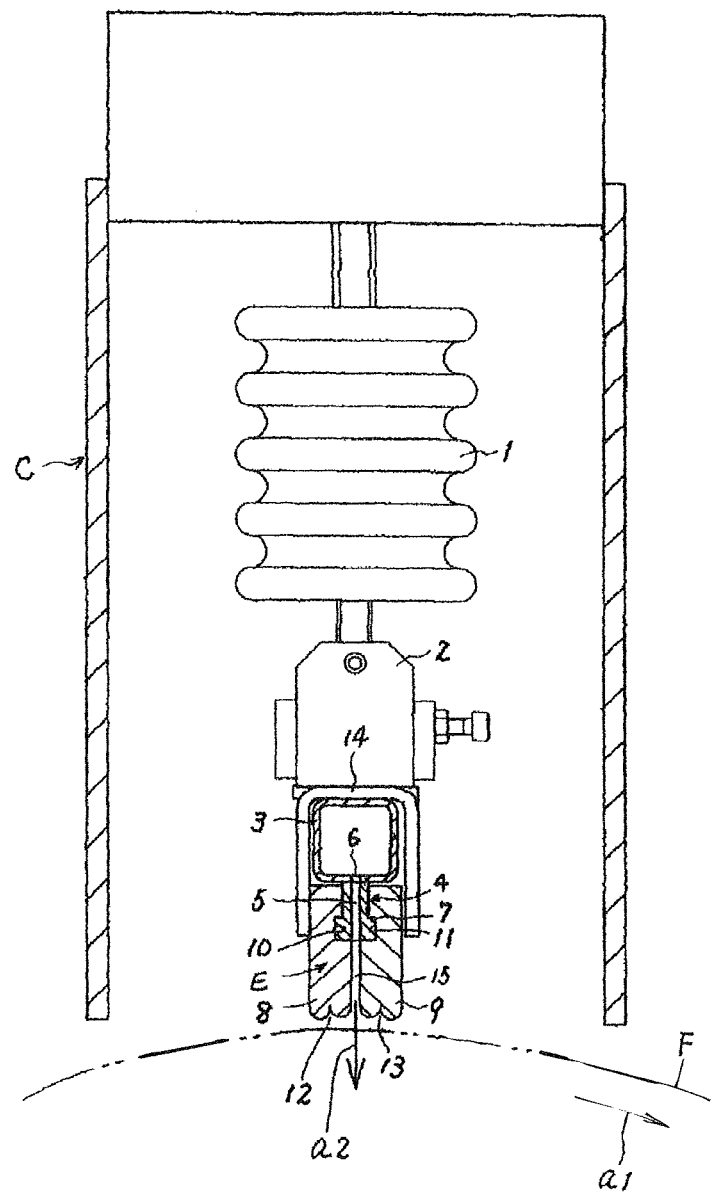
FIG. 1 is an enlarge view illustrating the inside of an electrode chamber.
Figure 2:
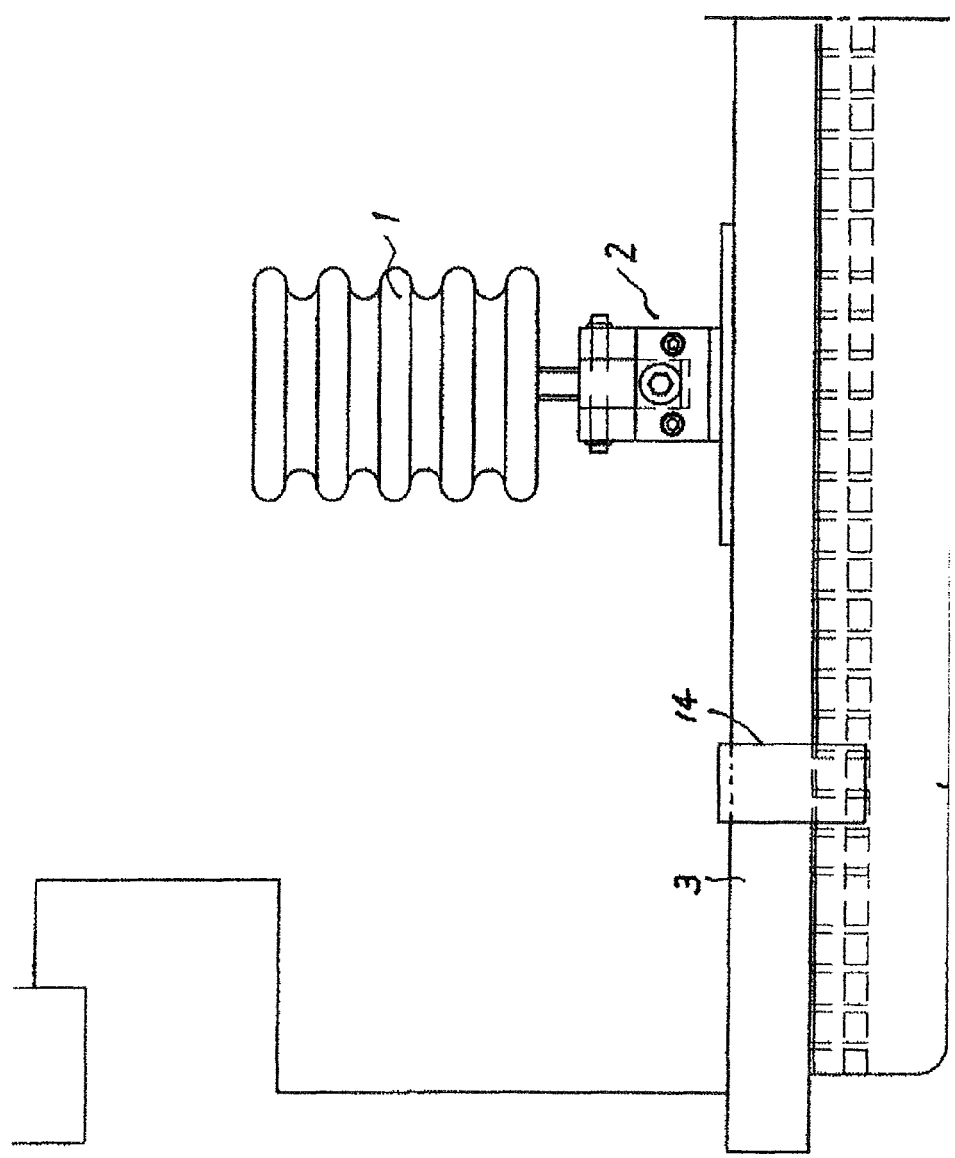
FIG. 2 is a diagram of the discharge electrode in the longitudinal direction, which shows part of the discharge electrode.

In an embodiment illustrated in the figures, an electrode chamber C has an opening facing a treatment roller which, although not shown, transfers a film F in the direction of arrow a1.

A manifold pipe 3 is fixed through an insulator 1 and a coupling member 2 that are fixed on the opposite side to the opening of the electrode chamber C, and the manifold pipe 3 is connected to a gas supply source which is not shown. And, the manifold pipe 3 holds a length equal to or longer than the width of the film F.

Also, a support member 4 is fixed, with a not-shown screw and/or the like, to the surface of the manifold pipe 3 that faces away from the coupling member 2, and the support member 4 has approximately the same length as that of the manifold pipe 3.

In the support member 4 placed in this manner, multiple gas guide holes 5 are formed to be maintained at regular intervals in the longitudinal direction. The gas guide holes 5 are configured to communicate with small holes 6 formed in the manifold pipe 3.

Therefore, a replacement gas introduced into the manifold pipe 3 is guided from the small holes 6 to the guide holes 5.

Note that the above-described guide holes 5 are not necessarily be limited to holes, and may be, for example, a porous sintered ceramic filter, a honeycomb filter or the like, which in short may take any form, as long as throttle resistance can be added to a gas flow passing through it and the pressure within the manifold pipe can be maintained constant.

In addition, a hook protrusion 7 jutting outward is formed in a distal end portion of the above-described support member 4, and a discharge electrode E which will be described below is configured to latch onto the hook protrusion 7.

The discharge electrode E includes a pair of plate-shaped electrode members 8, 9 having a length equal to or longer than the width of the film F which is a treatment base material.

The pair of electrode members 8, 9 is placed to face each other, and hook recesses 10, 11 are formed in the face-to-face surfaces of the electrode members 8, 9 to extend continuously in the length direction of the electrode members 8, 9.

Further, two arcs are continuously formed on the distal end portion of each of the above-described electrode members 8, 9, and also a vortex generation groove 12, 13 is formed between the arcs. The vortex generation grooves 12, 13 each have a length corresponding to the length of the electrode members 8, 9.

The electrode members 8, 9 as described above are located on the opposite side of the support member 4 from each other by engaging the hook recesses 10, 11 thereof on the hook protrusion 7 of the support member 4, and also a holder 14 clamps the pair of face-to-face electrode members 8, 9.

The holder 14 clamps in this manner, whereby the hook recesses 10, 11 of the respective electrode members 8, 9 are prevented from coming off the hook protrusion 7, so that the electrode members 8, 9 are supported firmly on the support member 4.

Also, an interstice corresponding to the length of the electrode members 8, 9 continuously extends in the face-to-face area between the pair of electrode members 8, 9 supported on the support member 4, the interstice serving as a gas passage 15. And, all the multiple gas guide holes 5 communicate with the gas passage 15. Furthermore, the gas passage 15 is open to a face-to-face area between the discharge electrode E and the treatment roller.

Note that each of the manifold pipe 3, the support member 4 and the electrode members 8, 9 is formed from an electric conductor and the manifold pipe 3 is connected to a high-voltage power source 16 in order to produce a corona discharge between the discharge electrode E and the treatment roller which is not shown.

The embodiment also includes a controller which, although not shown, controls the output of the high-voltage power source 16 which is an energy source for a corona discharge, and the rotational speed of the treatment roller.

In the configuration as described above, a replacement gas is fed into the manifold pipe 3, whereupon the replacement gas flows through the small holes 6 and the gas guide holes 5 to be emitted from the gas passage 15 toward the direction of arrow a2. That is, the replacement gas is emitted from between the pair of electrode members 8, 9. This means just that the replacement gas is emitted directly from the discharge electrode E.

In addition, since the length of the gas guide hole 5 can be ensured to correspond to the thickness direction of the support member 4, the throttle resistance is added to the gas flow passing through the gas guide hole 5. Because of this, the pressure within the manifold pipe 3 on the upstream side of the gas guide hole 5 is maintained constant, and therefore the gas pressure emitted from the multiple gas guide holes 5 becomes also equalized. Also, even when a somewhat change in pressure occurs on the gas-supply-source side, the manifold pipe 3 functions as a buffer. Accordingly, somewhat varies in pressure on the gas-supply-source side has little influence on the surface modification.

Further, because the length of the gas guide holes 5 can be increased to some extent as described above, combined with the function of maintaining the pressure in the manifold pipe 3, directivity can be imparted to the gas flow to be emitted from the gas guide holes 5. Imparting directivity to the gas flow in this manner enables the prevention of dispersion of the replacement gas to maintain a constant concentration of the replacement gas. Further, the directivity of the gas flow makes full use of the capabilities of breaking through a layer of air imported into the electrode chamber C by an entrained flow with the film F.

Further, the above-described controller controls the output of the high-voltage power source 16 which is the energy source for a corona discharge, and the rotational speed of the treatment roller, while correlating the output and the rotational speed with each other. In particular, in the embodiment, because the replacement gas is fed directly to a localized area which is a discharge area, the amount of replacement gas can be reduced. Achieving effective action of a small amount of replacement gas is dependent on the magnitude of discharge currents and the transfer speed of the film F. The controller is able to control the transfer speed of the film F and the discharge current in a relative manner in order to provide stable effects even when using a small amount of replacement gas.

Further, because the distal end of each of the pair of discharge electrodes 8, 9 is formed in an arc shape to eliminate any corner portion, any discharge does not occur intensively on a portion of the distal end of the discharge electrode.

According to the embodiment configured as described above, by engaging the hook recesses 10, 11 of the pair of electrode members 8, 9 with the hook protrusion 7 of the support member 4, the gas passage 15 is logically formed and also the gas guide holes 5 communicate with the resulting gas passage 15. And, the gas guide holes 5 can be formed sufficiently by hole machining, and the hole machining can be performed with precision at all times as long as a cutting tool with specified dimensions is selected. In short, there is no difficulty of forming a long slit as done conventionally, and the like.

INDUSTRIAL APPLICABILITY

The invention is most suitable for surface modification for films and the like.

REFERENCE SIGNS LIST

C . . . Electrode chamber
3 . . . Manifold pipe
4 . . . Support member
5 . . . Gas guide hole
6 . . . Small hole
E . . . Discharge electrode
8, 9 . . . Electrode member
12, 13 . . . Vortex generation groove
15 . . . Gas passage
F . . . Film
16 . . . High-voltage power source

The invention claimed is:
1. A surface modifying device, comprising a discharge electrode that is placed in an electrode chamber and has a length equal to or longer than a width of a treatment base material, and a treatment roller that transfers the treatment base material, the discharge electrode facing the treatment base material, a discharge being produced between the discharge electrode and the treatment roller, wherein
the discharge electrode includes a pair of electrode members each of which has a length approximately matching to the width of the treatment base material,
the electrode members face each other across a support member that is placed between them, the support member having a length approximately equal to the length of the electrode members,
an interstice is formed in the face-to-face area between the electrode members to serve as a gas passage, the gas passage has a distal end opening to a face-to-face area between the discharge electrode and the treatment roller, the support member has a plurality of gas guide holes formed therein in a longitudinal direction of the support member, the plurality of gas guide holes communicates with a replacement-gas feeding system, and the gas guide holes communicate with the gas passage.

2. The surface modifying device according to claim 1, further comprising a manifold pipe placed approximately parallel to the support member and having a plurality of small holes or slits formed therein in a longitudinal direction of the manifold pipe, wherein the small holes or slits communicate with the gas guide holes.

3. The surface modifying device according to claim 1, wherein each of the pair of electrode members has a distal end formed in an arc shape.

4. The surface modifying device according to claim 1, wherein the distal end of each of the pair of electrode members has a vortex generation groove formed therein, the vortex generation groove having a length in a direction approximately perpendicular to a transfer direction of the treatment base material.

5. The surface modifying device according to claim 1, further comprising a controller that controls a rotational speed of the treatment roller and output of a high-voltage power source serving as an energy source for a corona discharge.

6. The surface modifying device according to claim 2, wherein each of the pair of electrode members has a distal end formed in an arc shape.

7. The surface modifying device according to claim 2, wherein the distal end of each of the pair of electrode members has a vortex generation groove formed therein, the vortex generation groove having a length in a direction approximately perpendicular to a transfer direction of the treatment base material.

8. The surface modifying device according to claim 3, wherein the distal end of each of the pair of electrode members has a vortex generation groove formed therein, the vortex generation groove having a length in a direction approximately perpendicular to a transfer direction of the treatment base material.

9. The surface modifying device according to claim 2, further comprising a controller that controls a rotational speed of the treatment roller and output of a high-voltage power source serving as an energy source for a corona discharge.

10. The surface modifying device according to claim 3, further comprising a controller that controls a rotational speed of the treatment roller and output of a high-voltage power source serving as an energy source for a corona discharge.

11. The surface modifying device according to claim 4, further comprising a controller that controls a rotational speed of the treatment roller and output of a high-voltage power source serving as an energy source for a corona discharge.

* * * * *